(12) United States Patent
Hershberger

(10) Patent No.: US 7,924,092 B2
(45) Date of Patent: Apr. 12, 2011

(54) INTER-STAGE MATCHING NETWORK TO ENHANCE COMMON MODE STABILITY

(75) Inventor: Kyle Mark Hershberger, Marietta, GA (US)

(73) Assignee: Microsemi Corporation, Irvine, CA (US)

( * ) Notice: Subject to any disclaimer, the term of this patent is extended or adjusted under 35 U.S.C. 154(b) by 0 days.

(21) Appl. No.: 12/446,311

(22) PCT Filed: Oct. 22, 2007

(86) PCT No.: PCT/US2007/082111
§ 371 (c)(1),
(2), (4) Date: Jul. 20, 2009

(87) PCT Pub. No.: WO2008/051917
PCT Pub. Date: May 2, 2008

(65) Prior Publication Data
US 2010/0315167 A1    Dec. 16, 2010

Related U.S. Application Data

(60) Provisional application No. 60/853,130, filed on Oct. 20, 2006.

(51) Int. Cl.
*H03F 3/191* (2006.01)

(52) U.S. Cl. .................. 330/252; 330/302; 330/310

(58) Field of Classification Search .............. 330/295, 330/302, 310, 311
See application file for complete search history.

(56) References Cited

U.S. PATENT DOCUMENTS

| | | | |
|---|---|---|---|
| 4,112,386 A | * | 9/1978 | Everhart et al. ............... 330/265 |
| 5,132,893 A | | 7/1992 | Klein et al. |
| 5,172,017 A | | 12/1992 | Schmidt |

OTHER PUBLICATIONS

PCT International Search Report, dated May 2, 2008, from priority application.
PCT International Preliminary Report on Patentability, dated Apr. 22, 2009, from priority application.

* cited by examiner

*Primary Examiner* — Steven J Mottola
(74) *Attorney, Agent, or Firm* — Simon Kahn

(57) ABSTRACT

A two stage amplifier with an inter-stage matching network constituted of a first and a second transistor forming a differential first stage, a third and a fourth transistor forming a differential second stage, an on-chip connection path connecting the emitters of the first and second transistor to the emitters of the third and fourth transistors, a first transformation network and a second transformation network. A collector of the first transistor is operatively connected to a base of the third transistor by the first transformation network and a collector of the second transistor is operatively connected to a base of the fourth transistor by the second transformation network. At least one resistor is provided in the on-chip connection path to stabilize the input of the third and fourth transistors.

13 Claims, 3 Drawing Sheets

INTER-STAGE MATCHING NETWORK TO ENHANCE COMMON MODE STABILITY

CLAIM OF PRIORITY

This application claims priority to U.S. Provisional Application No. 60/853,130, filed on Oct. 20, 2006, the entire disclosure of which is incorporated by reference herein.

FIELD OF THE INVENTION

The present invention relates to differential RF/microwave multi-stage integrated circuit amplifiers, and more particularly to inter-stage matching networks to enhance common mode stability in differential amplifier designs.

BACKGROUND OF THE INVENTION

Referring to FIG. 1, integrated Circuit RF/Microwave amplifiers are typically constructed of multiple amplification stages 10, 11 and 12 connected in series on a single semiconductor die 05. First stage 10 connects to a signal source though an input impedance transformation network (not shown) that may be fabricated on-chip or off-chip, and last stage 12 connects to a load impedance through an output impedance transformation network (not shown) that also may be fabricated on-chip or off-chip. For amplifiers that have three or more stages, there will be one or more amplifier stages (for example stage 11) that are terminated on both their input and output by another amplifier stage. This applies to any amplification stage located between first 10 and last stage 12. The networks connecting these middle stages are referred to as inter-stage transformation networks.

The design and performance of inter-stage transformation networks is a major contributor to overall amplifier performance. Of particular interest for this invention is the role that the inter-stage networks play in preventing unwanted oscillations from occurring in the amplifier. The complexity of the design of inner-stage networks is reduced in many semiconductor technologies due to the presence of through-substrate vias. A through-substrate via is a path that penetrates the top semiconductor substrate surface where the active (and passive) devices are fabricated and connects directly to the bottom semiconductor substrate surface which is a metalized ground plane. The prevalent technology in the field of RF/Microwave amplifiers with through-substrate vias is Gallium Arsenide (GaAs). For technologies such as Si and SiGe, through-substrate vias are not an option since there is no bottom ground plane.

When developing RF/Microwave amplifiers in technologies that lack through-substrate vias, grounding becomes an important and difficult problem. The only means for connecting a Si amplifier circuit to ground is through the use of wirebonds that go between the chip and the package ground plane. The parasitic inductance from these wirebonds introduces a significant amount of inductance between the amplifier circuit and ground.

A common method for overcoming grounding problems is to utilize a differential amplifier topology. As one skilled in the art will understand, a differential amplifier topology allows for a virtual ground to be generated on-chip that will be independent of the amount of wirebond inductance present. By making use of this virtual ground, a high-performance differential circuit may be designed. Any input signal to a differential amplifier may be separated into differential-mode and common-mode components. As the name implies, the differential-mode signal is the primary mode of operation for the amplifier. However the common-mode performance of the amplifier must also be considered to ensure proper amplifier operation.

The virtual ground created in a differential amplifier is only present for differential-mode signals. All of the parasitic wirebond inductance is present for common-mode signals and presents numerous problems. Of particular concern is the reduced stability of the amplifier in the common-mode. The primary cause of the reduced common-mode stability results from the inductance caused by wirebonds 13, 14, and 15. The large inductance associated with wirebond 14, which is in series with the emitters of transistors 43 and 44 can cause devices 43 and 44 to become unstable. This is not a concern for the differential-mode signal since RF current does not flow through the wirebonds as shown by the equivalent differential-mode circuit shown in FIG. 3.

Another approach to reduce the effects of the inductance associated with wirebond 14 is to reduce the common-mode gain in order to improve the active device's stability. This can be done by adding resistive loss to the inter-stage network that only affects the common-mode signal. This allows for the differential mode signal to be unaffected while helping to stabilize the common-mode.

SUMMARY OF THE INVENTION

The present invention recognizes and addresses the foregoing considerations, and others, of prior art constructions and methods.

These and/or other objects are achieved by an amplifier comprising a first stage having at least one first transistor, and at least one second transistor, a second stage having at least one third transistor, and at least one fourth transistor, a first transformation network having a first ground and a second ground, and a second transformation network having a third ground and a fourth ground. The amplifier has a collector of the at least one first transistor is operatively connected to a base of the at least one third transistor by the first transformation network, a collector of the at least one second transistor is operatively connected to a base of the at least one fourth transistor by the second transformation network, the first ground and the third ground are electrically connected to each other, the second ground and the fourth ground are electrically connected to each other, an emitter of the at least one first transistor and an emitter of the at least one second transistor are electrically connected to the first ground and the third ground, and the second ground and the fourth ground are electrically connected to an emitter of the at least one third transistor and an emitter of the at least one fourth transistor.

In one embodiment, the electrical connection between the second and the fourth grounds and the at least one third and the at least one fourth transistor emitters further comprises a resistor. In another embodiment, the electrical connection between the first and the third grounds and the electrical connection between the second and fourth grounds are connected by at least a resistor. In another embodiment, the electrical connection between the first and the third grounds and the at least one first and the at least one second transistor emitters further comprises a resistor. In yet another embodiment, the electrical connection between the first and the third grounds and the electrical connection between the second and fourth grounds are connected by at least one resistor. In still other embodiments, the at least one first transistor further comprises a plurality of transistors connected in parallel, the at least one second transistor further comprises a plurality of transistors connected in parallel, the at least one third transistor further comprises a plurality of transistors connected in parallel, and the at least one fourth transistor further comprises a plurality of transistors connected in parallel.

In some of the embodiments, the electrical connections contain parasitics, where the parasitics may contain one or more resistive or inductive properties. In some of these embodiments, the at least one first, the at least one second, the at least one third, and the at least one fourth transistors are bipolar junction transistors. In some of these embodiments, the at least one first, the at least one second, the at least one third, and the at least one fourth transistors are bipolar junction transistors. In yet other of these embodiments, the at least one first, the at least one second, the at least one third, and the at least one fourth transistors are field effect transistors. Still in other embodiments, the at least one first, the at least one second, the at least one third, and the at least one fourth transistors are three terminal transconductance amplifier devices.

The accompanying drawings, which are incorporated in and constitute a part of this specification, illustrate one or more embodiments of the invention and, together with the description, serve to explain the principles of the invention.

BRIEF DESCRIPTION OF THE DRAWINGS

A full and enabling disclosure of the present invention, including the best mode thereof directed to one of ordinary skill in the art, is set forth in the specification, which makes reference to the appended figures, in which.

Figure 1:
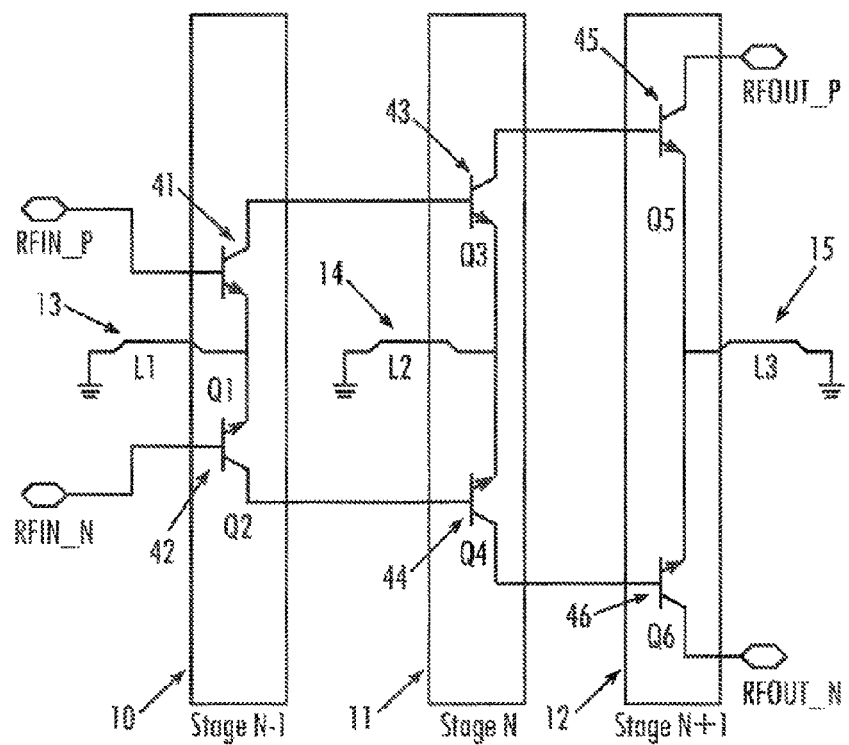
FIG. 1 is a simplified schematic diagram of a prior art differential three-stage amplifier.

Repeat use of reference characters in the present specification and drawings is intended to represent same or analogous features or elements of the invention.

DETAILED DESCRIPTION OF INVENTION

Reference will now be made in detail to presently preferred embodiments of the invention, one or more examples of which are illustrated in the accompanying drawings. Each example is provided by way of explanation of the invention, not limitation of the invention. In fact, it will be apparent to those skilled in the art that modifications and variations can be made in the present invention without departing from the scope and spirit thereof. For instance, features illustrated or described as part of one embodiment may be used on another embodiment to yield a still further embodiment. Thus, it is intended that the present invention covers such modifications and variations as come within the scope of the appended claims and their equivalents.

This invention provides a means for improving common-mode stability in multi-stage differential amplifiers. Common-mode stability is achieved by implementing circuitry to both reduce common-mode gain, provide an on-chip ground path, and to provide stabilizing positive resistance at the active device only for the common-mode. Additionally, effects causing the reduction of amplifier output are minimized by reducing the leakage of signal from one stage of the amplifier to a preceding stage.

Figure 2:
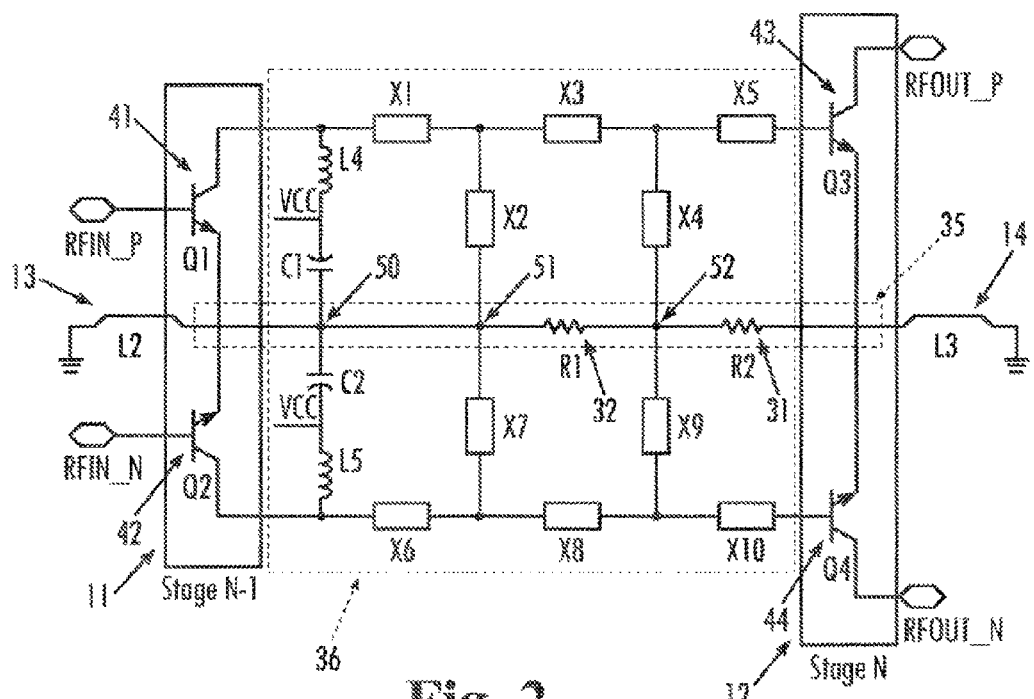
FIG. 2 is a schematic diagram showing two cascaded amplifier stages from the diagram of FIG. 1 incorporating an embodiment of this invention.

Referring to FIG. 2, an on-chip connection 35 is made from the emitters of transistors 41 and 42 to the emitters of transistors 43 and 44. In addition to connecting the emitters of the transistors, connection 35 also connects to all of the shunt components in inter-stage network 36. The addition of on chip-connection 35 provides an on-chip ground return path for the common-mode RF signal between amplifier stages 11 and 12. On-chip connection 35 can be modeled as a series inductance between amplifier stages 11 and 12, which is effectively in parallel with the inductances created by wirebonds 13 and 14. The parallel combination of the inductances results in an inductance that is smaller than the inductance of wirebonds 13 and 14 individually. However, the resultant parallel inductance is still large enough to cause common-mode stability problems.

Figure 3:
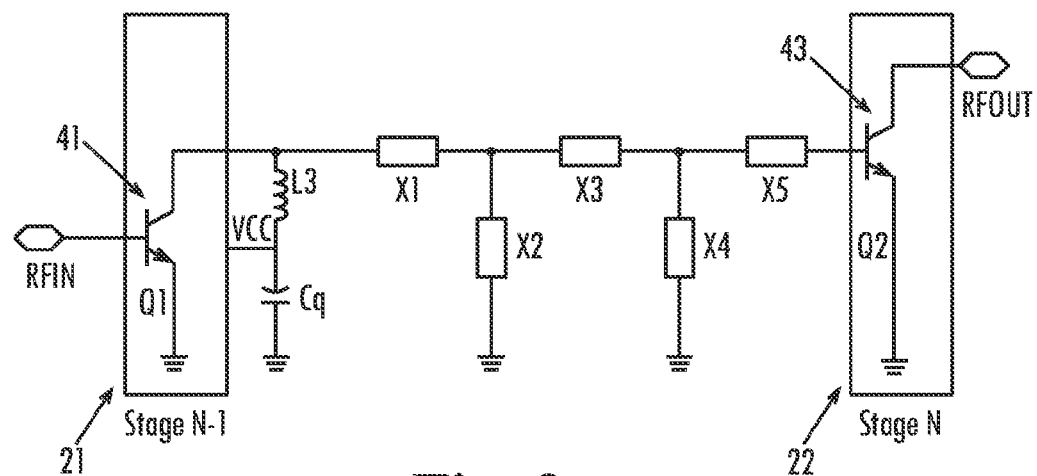
FIG. 3 is an equivalent circuit of FIG. 2 for the differential-mode signal in accordance with an embodiment of the present invention.
Figure 4:
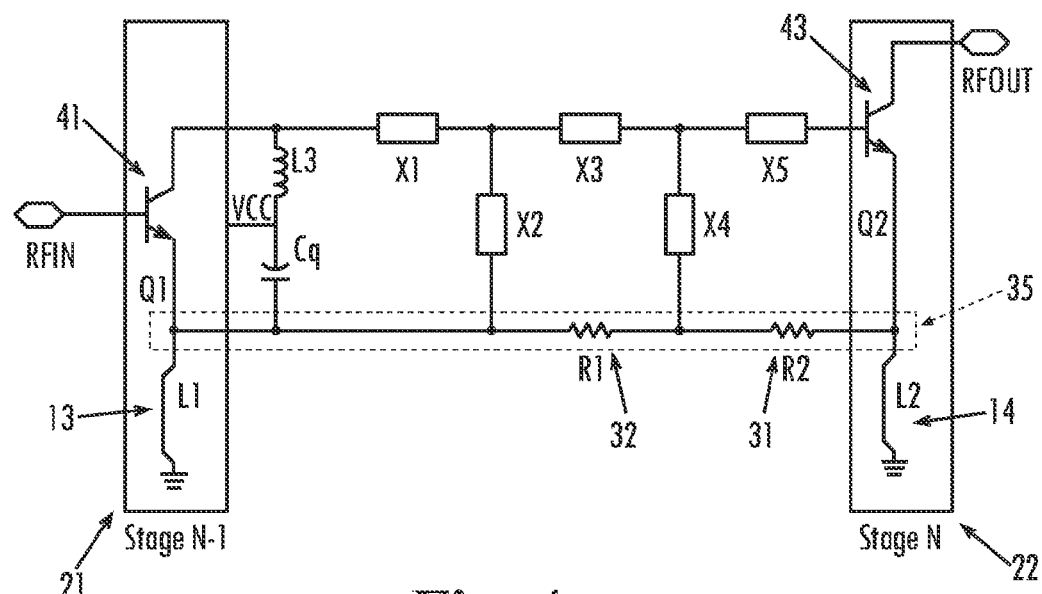
FIG. 4 is an equivalent circuit of FIG. 2 for the common-mode signal in accordance with an embodiment of the present invention.

To account for the common-mode stability problems caused by the resultant parallel inductance, a resistor, 31, is placed between the emitters of transistors 43 and 44 and the nearest shunt inter-stage network connection 52. Resistor 31 is a series component in the on-chip ground connection 35. The addition of resistor 31 has no impact on the differential-mode signal, as can be seen in FIG. 3 since in the differential mode on-chip connection 35 effectively is seen as ground. Resistor 31, however, does play an important role for common-mode signals, as seen in FIG. 4. In particular, resistor 31 causes the impedance of the shunt elements connected to node 52 to have a large positive real component of impedance. This positive real impedance component helps stabilize the input of transistors 43 and 44 by cancelling any potential negative real part impedance generated by transistors 43 and 44, in addition to increasing the loss of network 36 (FIG. 2) for common-mode signals thus reducing the common mode gain of amplifier 13.

An appropriate value for resistor 31 may be determined through the observation of the small-signal stability of amplifier stage 11 as the value of resistor 31 is varied. Resistor 31 should be of a large enough value to ensure that the amplifier is satisfactorily stable. Rollett's stability factor (K) may also be used as an appropriate measure of amplifier stability. As one skilled in the art would recognize, by selecting a value of resistor 31 that results in a Rollett's stability factor of above one at all frequencies of interest, the amplifier should be unconditionally stable. A practical method for determining an appropriate value of resistor 31 is by creating an electrical model of the full differential amplifier in FIG. 1, including all wirebond paracitics. One skilled in the art may then use a RF circuit simulator, such as Agilent's Advanced Design System, to simulate this electrical model and observe the stability at the input of amplifier stage 11 when driven with both differential and common mode signals.

Referring to FIG. 4, the addition of on-chip ground connection 35 creates a feedback path 35 for signals from amplifier stage 22 back into stage 21. Current exiting the emitters of transistors 43 during large-signal excitation has two ground return paths. One path is directly through wirebond 14 and the other path is through on-chip ground connection 35 and through wirebond 13 to ground. This path creates a feedback signal at the emitters of transistors 41 that may reduce the amount of output power that amplifier stage 21 is capable of delivering. To prevent the reduction of output power from stage 21, an additional resistor 32 may be placed in on-chip ground connection 35 to isolate the current due to stage 22 by forcing it through wirebond 14 rather than both wirebond 13 and 14. This is of particular concern for large signal levels as both differential-mode and common-mode signals will generate currents that can leak from stage 22 back trough connection 35 into stage 21.

A suitable value for resistor 32 may be determined by observing the effect of resistor 32 on the differential output power at which amplifier stage 21 compresses. Resistor 32 should be increased until the compression level of amplifier stage 21 becomes insensitive to small variations in resistor 32. One skilled in the art could perform such an analysis by performing a harmonic balance simulation, utilizing a simulation tool such as Agilent's Advanced Design System, on a complete electrical model of the amplifier in FIG. 1. Such a model should include all wirebond paracitics and incorporate non-linear device models for the active components.

Figure 5:
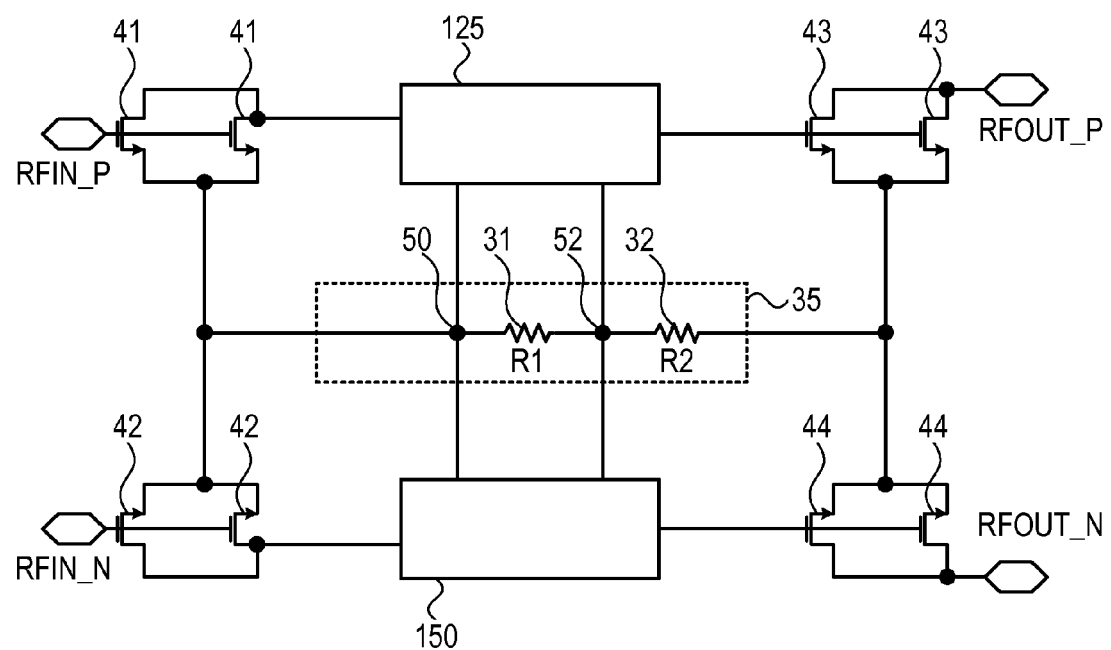
FIG. 5 illustrates a high level schematic diagram of the amplifier of FIG. 2, wherein each transistor comprises a plurality of transistors.

FIG. 5 illustrates a high level schematic diagram of the amplifier of FIG. 2 wherein each of the transistors comprises a plurality of transistors, illustrated without limitation as FET transistors. In further detail, the amplifier of FIG. 5 comprises: an on-chip connection 35; a plurality of FET transistors 41 connected in parallel; a plurality of FET transistors 42 connected in parallel; a plurality of FET transistors 43 connected in parallel; a plurality of FET transistors 44 connected in parallel; a first transformation network 125; and a second transformation network 150. On-chip connection 35 comprises: a resistor 31, denoted R1 and connected between node 50 and node 52 of on-chip connection 35; and a resistor 32, denoted R2 and connected between node 52 of on-chip connection 35 and the common sources of plurality of FET transistors 43 and plurality of FET transistors 44. On-chip connection 35 connects the common sources of plurality of FET transistors 43 and 44 to the common sources of plurality of FET transistors 41 and 42. First transformation network 125 and second transformation network 150 form inter-stage network 36 as described above in relation to FIG. 2. Alternatively, transistors 41, 42, 43 and 44 may be replaced with three terminal transconductance amplifier devices.

While one or more preferred embodiments of the invention have been described above, it should be understood that any and all equivalent realizations of the present invention are included within the scope and spirit thereof. The embodiments depicted are presented by way of example only and are not intended as limitations upon the present invention. Thus, it should be understood by those of ordinary skill in this art that the present invention is not limited to these embodiments since modifications can be made. Therefore, it is contemplated that any and all such embodiments are included in the present invention as may fall within the scope and spirit thereof.

What is claimed:

1. An amplifier comprising:
    a. a first stage differential amplifier having
        i. at least one first transistor, and
        ii. at least one second transistor,
            wherein said at least one first transistor and said at least one second transistor are arranged to form said first stage differential amplifier with a first stage common node;
    b. a second stage differential amplifier having
        i. at least one third transistor, and
        ii. at least one fourth transistor;
            wherein said at least one third transistor and said at least one fourth transistor are arranged to form said second stage differential amplifier with a second stage common node;
    c. an on-chip connection path arranged to connect the first stage common node to the second stage common node;
    d. a first transformation network comprising a first shunt component and a second shunt component, said first shunt component closer to said second stage than said second shunt component, an end of said first shunt component connected to a first node of said on-chip connection path and an end of said second shunt component connected to a second node of said on-chip connection path; and
    e. a second transformation network comprising a third shunt component and a fourth shunt component, said third shunt component closer to said second stage than said fourth shunt component, an end of said third shunt component connected to the first node of said on-chip connection path, and an end of said fourth shunt component connected to the second node of said on-chip connection path,
    wherein
        a first output of said first differential stage, associated with said at least one first transistor, is operatively connected to a first input of said second differential stage, associated with said third transistor, by said first transformation network,
        a second output of said first differential stage, associated with said at least one second transistor, is operatively connected to a second input of said second differential stage, associated with said fourth transistor, by said second transformation network, and
        wherein said on-chip connection path comprises a first resistor inserted between the second stage common node and the first node of the on-chip connection.

2. The amplifier of claim 1, wherein a first input of said first stage differential amplifier, associated with said at least one first transistor, and a second input of said first stage differential amplifier, associated with said at least one second transistor, are operatively coupled to an input of said amplifier.

3. The amplifier of claim 2, wherein a first output of said second stage differential amplifier, associated with said at least one third transistor, and a second output of said second stage differential amplifier, associated with said at least one fourth transistor, are operatively coupled to an output of said amplifier.

4. The amplifier of claim 1, wherein
    a. said at least one first transistor further comprises a plurality of transistors connected in parallel;
    b. said at least one second transistor further comprises a plurality of transistors connected in parallel;
    c. said at least one third transistor further comprises a plurality of transistors connected in parallel; and
    d. said at least one fourth transistor further comprises a plurality of transistors connected in parallel.

5. The amplifier of claim 1, further comprising:
    a first wirebond arranged to connect the second stage common node to ground.

6. The amplifier of claim 5, further comprising a second wirebond arranged to connect the first stage common node to ground.

7. The amplifier of claim 6, wherein said on-chip connection path further comprises a second resistor inserted between the first node and the second node of the on-chip connection path.

8. The amplifier of claim 1, wherein each of said first transformation network and said second transformation network further comprises an additional shunt path comprising a series connected inductor and capacitor, one end of the additional shunt path of each of said first transformation network and said second transformation network connected to the second node of said on-chip connection path.

9. The amplifier of claim 1, wherein said at least one first transistor and said at least one second transistor are constituted of bipolar transistors.

10. The amplifier of claim 1, wherein said at least one third transistor and said at least one fourth transistor are constituted of bipolar transistors.

11. The amplifier of claim 1, wherein said at least one first transistor and said at least one second transistor are constituted of field effect transistors.

12. The amplifier of claim 1, wherein said at least one third transistor and said at least one fourth transistor are constituted of field effect transistors.

13. The amplifier of claim 1, wherein at least one of said first stage differential amplifier and said second stage differential amplifier are constituted of three terminal transconductance amplifier devices.

* * * * *